US011728192B2

(12) United States Patent
Miao et al.

(10) Patent No.: US 11,728,192 B2
(45) Date of Patent: Aug. 15, 2023

(54) REFINING DEFECT DETECTION USING PROCESS WINDOW

(71) Applicant: GLOBALFOUNDRIES U.S. Inc., Malta, NY (US)

(72) Inventors: Chenlong Miao, Mechanicville, NY (US); Haizhou Yin, Halfmoon, NY (US); Michael J. Wojtowecz, Ballston Spa, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 222 days.

(21) Appl. No.: 17/382,415

(22) Filed: Jul. 22, 2021

(65) Prior Publication Data

US 2023/0024266 A1 Jan. 26, 2023

(51) Int. Cl.
*H01L 21/67* (2006.01)
*G06T 7/00* (2017.01)
*G01N 23/2251* (2018.01)

(52) U.S. Cl.
CPC ... *H01L 21/67288* (2013.01); *G01N 23/2251* (2013.01); *G06T 7/001* (2013.01); *G01N 2223/071* (2013.01); *G01N 2223/401* (2013.01); *G06T 2207/10061* (2013.01); *G06T 2207/30148* (2013.01)

(58) Field of Classification Search
CPC ... H01L 21/67288; H01L 22/14; H01L 22/20; H01L 22/12; G01N 23/2251; G01N 2223/071; G01N 2223/401; G01N 21/956; G06T 7/001; G06T 2207/10061; G06T 2207/30148

USPC .......... 356/237.2–237.5, 630–632, 484, 432; 382/149

See application file for complete search history.

(56) References Cited

U.S. PATENT DOCUMENTS

| | | | |
|---|---|---|---|
| 8,547,429 B2 | 10/2013 | Honda et al. | |
| 9,201,022 B2 | 12/2015 | Hu et al. | |
| 9,310,320 B2 | 4/2016 | Kurada et al. | |
| 9,330,987 B2 | 5/2016 | Lin et al. | |

(Continued)

OTHER PUBLICATIONS

Esposito et al., "Analysis of Systematic Weak Point Structures using Design Based Automatic Defect Classification and Defect Review SEM Platform," IEEE, 2020, pp. 1-4.

(Continued)

*Primary Examiner* — Isiaka O Akanbi
(74) *Attorney, Agent, or Firm* — Anthony Canale; Hoffman Warnick LLC (57) ABSTRACT

An optical inspection is performed to detect potential defects within integrated circuit devices and a first electron-based inspection of less than all of the potential defects is performed to identify primary actual defects. A process window of manufacturing parameter settings used to manufacture the integrated circuit devices is identified and the integrated circuit devices manufactured using the manufacturing parameter settings inside the process window have less than a threshold number of the primary actual defects. To identify additional actual defects a second electron-based inspection is performed that is limited to selected ones of the potential defects in the integrated circuit devices that were manufactured using the manufacturing parameter settings inside the process window but were uninspected in the first electron-based inspection.

20 Claims, 5 Drawing Sheets

(56) References Cited

U.S. PATENT DOCUMENTS

| | | | |
|---|---|---|---|
| 9,891,538 B2 | 2/2018 | Plihal | |
| 2005/0104017 A1* | 5/2005 | Kimba | H01J 37/29 |
| | | | 250/559.07 |
| 2006/0244958 A1* | 11/2006 | Furman | G01N 21/9501 |
| | | | 356/237.4 |
| 2006/0291714 A1* | 12/2006 | Wu | G03F 7/7065 |
| | | | 382/149 |
| 2007/0109557 A1* | 5/2007 | Saito | H01J 37/20 |
| | | | 356/602 |
| 2015/0154746 A1* | 6/2015 | Zafar | G03F 1/84 |
| | | | 382/149 |
| 2016/0018340 A1* | 1/2016 | Otani | G01N 21/8851 |
| | | | 356/237.2 |
| 2016/0150191 A1* | 5/2016 | Karsenti | H04L 67/306 |
| | | | 382/149 |
| 2018/0293720 A1* | 10/2018 | Yoshitake | G03F 7/20 |
| 2019/0271542 A1* | 9/2019 | Shchegrov | G01B 11/272 |

OTHER PUBLICATIONS

Jansen et al., "Utilizing Design Layout Information to Improve Efficiency of SEM Defect Review Sampling," IEEE/SEMI Advanced Semiconductor Manufacturing Conference, 2008, pp. 69-71.

Khor et al., "Application of SEM API on PWQ Wafer SEM Review," ECS—The Electromechanical Society, ECS Transactions, vol. 44, No. 1, 2012, Abstract.

Patterson et al., "E-Beam Inspection System for Comparison of Wafer and Design Data," Proceddings of SPIE, vol. 8324, 2012, pp. 1-10.

Xu et al., "Defect Sampling Methodology for Yield Learning During 22nm Process Development," IEEE, 2013, pp. 268-271.

\* cited by examiner

REFINING DEFECT DETECTION USING PROCESS WINDOW

BACKGROUND

Field of the Invention

The present disclosure relates to integrated circuit design and manufacturing and more specifically to systems and processing that identifies defects within integrated circuit devices.

Description of Related Art

When designing integrated circuit devices (ICs) engineers often first generate a design and then model the design using computer simulations. The simulations help the designer understand where possible defects might occur in production devices. However, regardless of how much simulation is performed, eventually actual test devices and finished products are produced. These produced/manufactured actual physical devices are often inspected and electronically tested to identify actual or potential defects.

SUMMARY

Some systems and methods herein perform an optical inspection to detect potential defects within integrated circuit devices and perform a first electron-based inspection of less than all of the potential defects to identify primary actual defects. Such systems and methods identify a process window of settings of manufacturing parameters used to manufacture the integrated circuit devices. The integrated circuit devices manufactured using the manufacturing parameter settings inside the process window have less than a threshold number of the primary actual defects. To identify additional actual defects these systems and methods perform a second electron-based inspection that is limited to selected ones of the potential defects in the integrated circuit devices that were manufactured using the manufacturing parameter settings inside the process window but were uninspected in the first electron-based inspection.

Other systems and methods herein manufacture integrated circuit devices to include components formed in patterns. The manufacturing of the integrated circuit devices uses different manufacturing parameters for the patterns on different ones of the integrated circuit devices, and each pattern is formed differently multiple times using the different manufacturing parameters. These systems and methods perform an optical inspection to detect potential defects in the integrated circuit devices and perform a first electron-based inspection on less than all of the potential defects to identify primary actual defects. Such systems and methods identify a process window of settings of manufacturing parameters, where the patterns manufactured using the manufacturing parameter settings outside the process window have at least a threshold number of the primary actual defects, and ones of the patterns manufactured using the manufacturing parameter settings inside the process window have less than the threshold number of the primary actual defects. To identify additional actual defects the systems and methods perform a second electron-based inspection limited to some of the patterns that meet all conditions of: having the potential defects; being uninspected in the first electron-based inspection; and being patterns manufactured using the manufacturing parameter settings inside the process window.

Systems herein can include a processor, an optical inspection tool operatively connected to the processor, and an electron-based inspection tool operatively connected to the processor. The optical inspection tool is adapted to optically detect potential defects within integrated circuit devices. The integrated circuit devices have components formed in patterns. The integrated circuit devices are formed using different manufacturing parameters for the patterns on different areas of the integrated circuit devices. The electron-based inspection tool is adapted to perform a first electron-based inspection of less than all of the potential defects to identify primary actual defects. The processor is adapted to identify a process window of manufacturing parameter settings. Ones of the patterns manufactured using the manufacturing parameter settings inside the process window have less than the threshold number of the primary actual defects. The electron-based inspection tool is adapted to identify additional actual defects by performing a second electron-based inspection of some of the patterns that meet all conditions of: having the potential defects; being uninspected in the first electron-based inspection; and being patterns manufactured using the manufacturing parameter settings inside the process window.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, regardless of how much simulation is performed, eventually actual test devices and finished products are produced. These produced/manufactured actual physical devices are often inspected and electronically tested to identify actual or potential defects. The additional information produce by such testing is utilized by the IC designer to possibly modify the design so that the number of defects is reduced, and the overall operation of the device is made more efficient. Such inspections and testing can be performed on finished devices or partially completed devices (e.g., in-process inspection/testing). Therefore, in-process inspections increase yield during the fabrication of integrated circuit devices.

Process window qualification (PWQ) is one type of semiconductor inspection. In PWQ, an actual physical integrated circuit devices (e.g., wafer, substrate, etc.) is manufactured using different focus and exposure parameters for the different devices thereon (e.g., different chips, different circuits, different components) to provide different examples of possible manufacturing conditions where the focus and/or exposure may vary. Changing the focus and exposure can change the shapes, sizes, and impurity concentrations of the various components.

These different focus/exposure settings are sometimes referred to as "modulations." Such a device is sometimes referred to as a focus-exposure modulated integrated circuit devices because different components (potentially identically designed components) are manufactured on the same surface (e.g., wafer, layer, etc.) using different focus and exposure settings resulting in identically designed components being manufactured differently within the same integrated circuit devices.

Thus, as part of the integrated circuit design process, focus-exposure modulated integrated circuit devices are used. Defects are identified in the focus-exposure modulated integrated circuit devices to allow an acceptable range of focus and exposure settings to be established (to achieve specific yield, cost, manufacturing speed, and other production goals) to find what is referred to as an acceptable focus-exposure "process window." Devices manufactured using focus and exposure settings that are within the process window will generally have the desired yield, cost, etc., while those devices manufactured using focus and exposure manufacturing parameter settings outside the process window generally will not.

More specifically, the focus-exposure modulated integrated circuit devices are first inspected using optical inspection tools, such as a bright field inspection (BFI) tool. Such optical inspection tools produce optical images of the integrated circuit devices that have light and dark regions, which are commonly referred to as "hotspots." Hotspots can indicate potential defects, such as pinching, bridging, line-end shortening, etc., where the components (conductor and insulator shapes) within the focus-exposure modulated integrated circuit devices deviate from the corresponding semiconductor design.

The optically (BFI) detected defects (hotspots) are divided into "bins" (classified) using processing that classifies the defects by type of manufacturing error (e.g., shorts, opens, missing shapes, extra shapes, etc.). Each bin or class of optically-detected defect has a design structure or shape (herein sometimes simply referred to as a "pattern") that is unique relative to the patterns of components classified into other bins. Therefore, each bin contains a single pattern that potentially results in an error that would prevent the integrated circuit from operating as designed (results in yield loss). While each bin contains a single pattern, each bin can contain hotspots formed using different combinations of focus and exposure settings applied to the pattern of that bin because of the different focus and exposure settings applied to the different locations of the focus-exposure modulated integrated circuit devices.

To determine whether a bin's potentially defective pattern actually causes yield loss (e.g., whether a hotspot is an actual defect) an electron-based (non-optical) inspection, such as scanning electron microscopy (SEM) inspection, is performed. Electron-based inspections are expensive in terms of equipment utilization and time. Therefore, a very small percentage (e.g., less than 5% or even less than 1%) of the hotspots are subjected to electron-based inspection. Thus, various sampling strategies (using randomness and/or logic) are used to determine which hotspots are subject to electron-based inspection, which can result in a limited inspection of focus and exposure settings for some bins. This can result in some bins (some patterns) not being subjected to any electron-based inspection.

As a result of the (somewhat random and infrequent) electron-based sampling, a few representative defects from each bin can be identified at different focus/exposure settings. This time-consuming procedure checks how a structure responds to changes in lithography parameters (focus/exposure) and this allows the process window limits to be determined. Specifically, various goals (e.g., yield, cost, performance, manufacturing speed, and other production goals) are used to determine which focus and exposure parameters will meet the goals and which will not. Those focus and exposure parameters that are within the process window will meet the goals, while those outside will not.

To increase sensitivity, a second iteration can be performed only on one or more of bins (e.g., the defective patterns/shapes) identified by the electron-based inspection and such now-known defects are sometimes referred to as "care areas." The care areas are bins or patterns that the integrated circuit designer wants to look at in greater detail because of an unusually high number or percentage of defects within the bins, or because such defects are considered to have disproportionate impact on the operation of the integrated circuit. In the additional iterations, less than all of the patterns (bins) are selected to receive additional electron-based inspections to provide more data for those selected patterns. The additional SEM iterations of this processing help refine the borders of the process window by performing more SEM inspection on a small number of bins to provide greater testing details.

In one example, more than 100,000 optical-inspection hotspots may only result in less than 1,000 electron-based confirmed defects. Additionally, such processing can identify over 10,000 patterns (bins) that have the potential for causing an integrated circuit component defect and can provide rates of defects for each pattern and various statistical analyses, etc. This allows additional refinement of the process window to focus review on higher sample rates or hit rates on certain defect levels.

Figure 1:
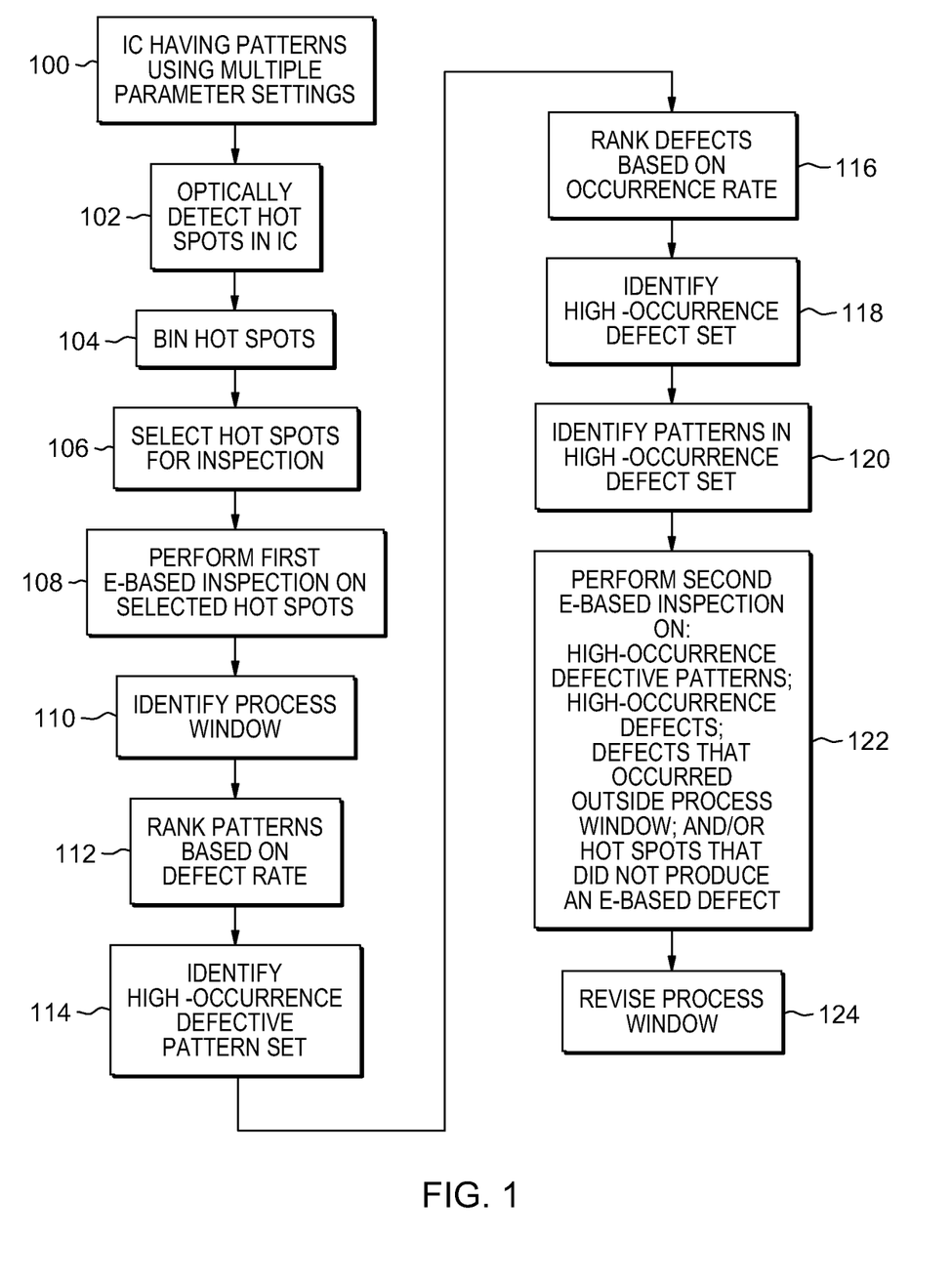
FIG. 1 is a flow diagram illustrating processing performed by embodiments herein.

As shown in the flowchart in item 100 in FIG. 1, methods herein manufacture a focus-exposure modulated integrated circuit devices (IC) to include components formed in patterns. The manufacturing of the focus-exposure modulated integrated circuit devices in item 100 uses different manufacturing parameters (e.g., exposure and focus) for the patterns on different areas of the integrated circuit devices, and each pattern is formed differently multiple times using the different manufacturing parameters. In item 102, these methods optically detect (e.g., using bright field inspection (BFI) for example) potential defects within the whole (all of the) focus-exposure modulated integrated circuit devices. Again, these potential defects are commonly referred to as "hotspots."

In item 104, the optically (BFI) detected potential defects are divided into "bins" (classified) by processing that classifies the defects by type of error. Each bin or class of optically-detected defect has a pattern that is unique relative to the other optically-detected defect bins. Therefore, each bin contains a single pattern, and each bin can contain hotspots formed using different combinations of focus and exposure settings applied to the pattern of that bin.

In item 106, potentially using information from the binning process, various sampling strategies (using randomness and/or logic) are used to determine which hotspots are subject to electron-based inspection. Then, in item 108, these methods perform a first electron-based inspection (e.g., scanning electron microscope (SEM) inspection) on less than all (e.g., less than 5% or even less than 1%) of the potential defects, and this first electron-based inspection identifies primary actual defects.

In item 110, such methods identify a process window. The process window is a range of manufacturing parameter settings. The patterns, when manufactured using the settings that are outside the process window, will have at least a threshold number of the primary actual defects that resulted from the first electron-based inspection. However, the patterns manufactured using the manufacturing parameter settings inside the process window have less than the threshold number of the primary actual defects that resulted from the first electron-based inspection. The threshold numbers (threshold manufacturing parameter settings) used to define the limits of the processing window could be, for example, limited to integers and could be set to 1 to mandate that the patterns manufactured using the manufacturing parameter settings inside the process window have no primary actual defects while those outside have at least one primary actual defect. Alternatively, higher threshold numbers and non-integers can be used, depending upon different technologies and manufacturing goals.

In later steps (e.g., 122), the methods herein perform a second electron-based inspection. In preparation for such additional electron-based inspection, in item 112, these methods can rank the patterns based on the rate of occurrence of primary actual defects within each of the patterns. This allows these methods, in item 114, to select the patterns that are most commonly defective to establish a high-occurrence defective pattern set of the most common defective patterns (based on the previous ranking in item 112).

In further preparation for such additional electron-based inspection, in item 116, these methods can rank the primary actual defects based on their rate of occurrence. In item 118, these methods then establish a high-occurrence defect set of the most common primary actual defects (based on the ranking in item 116). In item 120, these methods then identify the patterns in which the primary actual defects in the high-occurrence defect set occur, and this set is identified as a high-defect pattern set.

To identify additional actual defects, in item 122 these methods perform a second electron-based inspection (e.g., again the same scanning electron microscope (SEM) inspection) that is limited to some of the patterns that meet all the following conditions: they have the potential defects from item 102; they were skipped or not inspected (uninspected) in the first electron-based inspection in item 108; and the integrated circuit devices have patterns that were manufactured using manufacturing parameter settings within the process window identified in item 110.

In some embodiments, the second electron-based inspection (within the process window) is performed potentially only on patterns matching some of the patterns in the high-occurrence defective pattern set or potentially only on patterns matching some of the patterns in the high-defect pattern set. In other embodiments, the second electron-based inspection (of items manufactured using settings within the process window) in item 122 is performed potentially only on ones of the potential defects in the component patterns that match component patterns that were manufactured using the manufacturing parameter settings outside the process window and that exhibited the primary actual defects. In further embodiments, the second electron-based inspection in item 122 is performed potentially only on ones of the potential defects in the component patterns that match component patterns that were manufactured using the manufacturing parameter settings outside the process window and that were uninspected in the first electron-based inspection.

In item 124, the methods herein can revise the process window by changing the manufacturing parameter settings so that the additional actual defects are also outside the process window.

Figure 2:
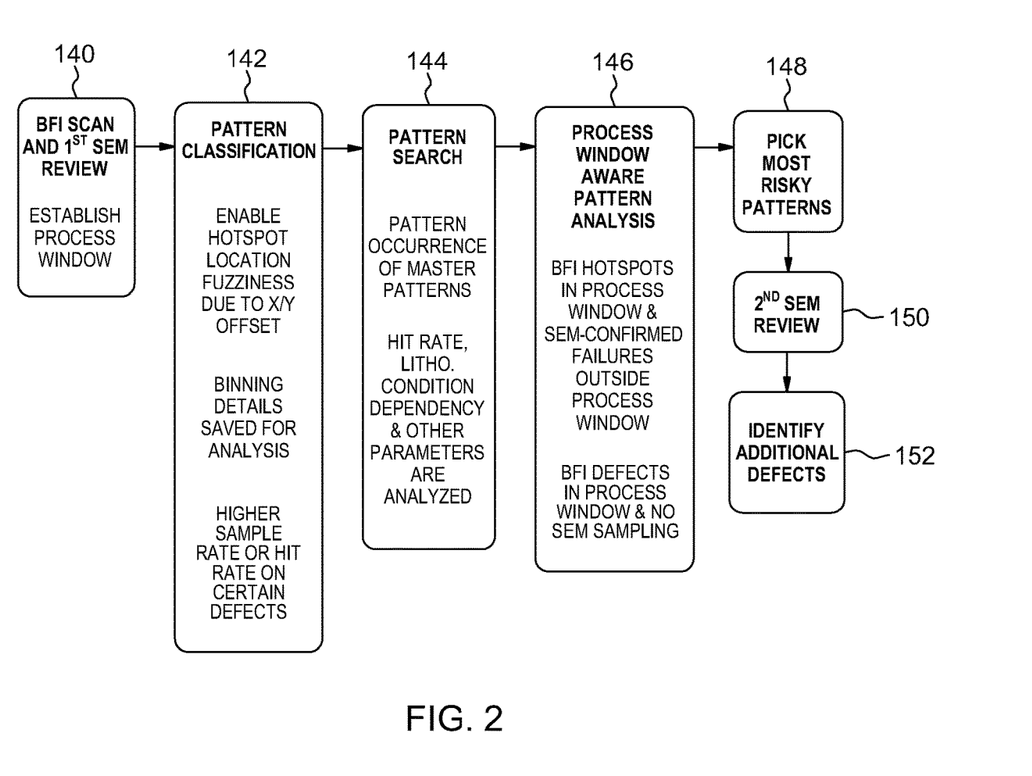
FIG. 2 is a diagram conceptually illustrating operations performed by systems and methods herein.

FIG. 2 is a conceptual diagram showing how processing can be performed with the systems and methods herein. More specifically, FIG. 2 shows, in item 140, that these systems and methods establish an initial process window using the processing shown in items 100-110 in the flowchart of FIG. 1. Specifically, in item 140, the systems and methods herein perform a first iteration SEM review based on hotspots shown in a BFI scan.

In item 142, the systems and methods herein classify (bin) the various patterns based on each hotspot's location within the overall focus-exposure modulated integrated circuit devices. The processing in item 142 can enable hotspot location adjustments (e.g., "fuzziness") based on how far the hotspot is from the very center (or other reference point) of the focus-exposure modulated integrated circuit devices (the x/y offset location of each different hotspot). Additionally, in item 142 the various binning details (e.g., manufacturing parameters of hotspot, type of shape, size of shape, relative hotspot location, etc.) can be maintained for later analysis. Item 142 also shows that care areas may be established for additional SEM iterations by setting a higher sample rate or hit rate on certain defects.

In item 144, the patterns that produced hotspots are search by the systems and methods herein to identify patterns within the process window that should be subjected to additional inspection. Thus, item 144 can rank the patterns based upon which patterns most commonly produced hotspots or based upon which hotspots most commonly produced SEM-detected defects. For example, item 144, can identify which patterns should be subjected to additional inspection based upon the hit rate, which is the rate at which a hot-spot producing pattern also produced an SEM-detected defect. This evaluation can take into account the lithographic condition dependency, which can include the focus and exposure, as well as other parameter settings.

This allows the systems and methods here into perform a "process window aware" pattern analysis in item 146. In one example, the processing in item 146 can perform additional SEM inspection of hotspots in patterns (manufactured using the manufacturing parameter settings inside the process window) that match the patterns manufactured using the manufacturing parameter settings outside the process window that exhibited the primary actual defects. In another example, the processing in item 146 can perform additional SEM inspection of hotspots in patterns (manufactured using the manufacturing parameter settings inside the process window) that match the patterns manufactured using the manufacturing parameter settings outside the process window that were uninspected in the first electron-based inspection.

In item 148, the systems and methods herein determine which patterns that are identified in item 144 as being candidates for additional SEM inspection and that are within the process window are actually to be subjected to the additional round of SEM review based on risk factors of the patterns. Some of the risk factors can include how close a pattern is to the edge of the process window, whether the hit rate for a given pattern is relatively higher than for other patterns, the relative performance loss that can be expected if a specific pattern is defective, etc.

Therefore, if a hotspot that is within the process window is selected by the process window aware pattern analysis 146 and is considered sufficiently risky in item 148, that hotspot will be subjected to additional SEM review by the systems and methods herein in item 150. From this additional SEM review, the systems and methods herein identify additional defects exclusively (only) within the process window as shown in item 152.

Figure 3:
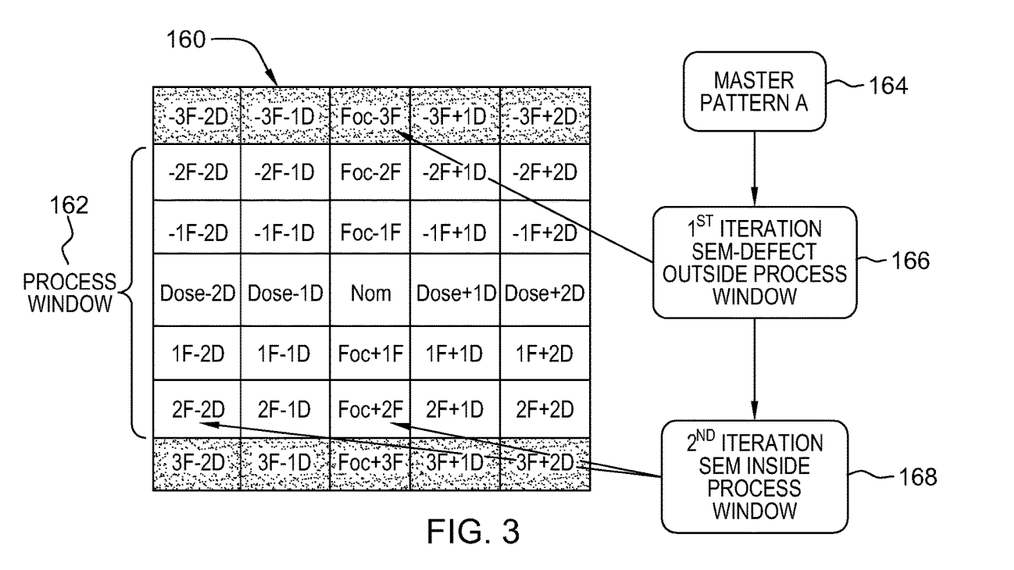
FIGS. 3 and 4 are flow diagrams conceptually illustrating a process window and the interactions of systems and methods herein.
Figure 4:
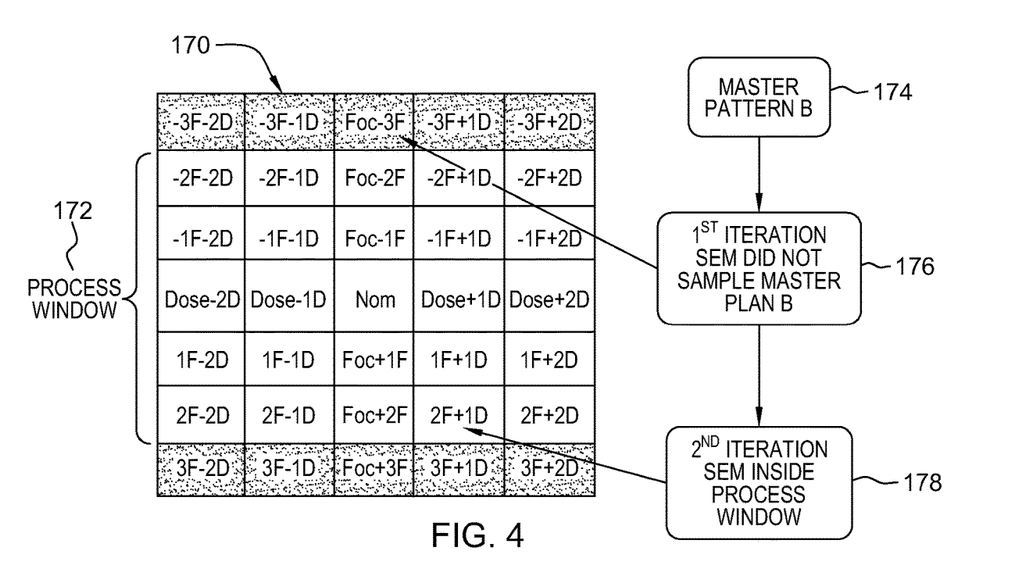

FIGS. 3 and 4 are flowcharts that illustrate the situations, mentioned above, where the processing in item 146 performs additional SEM inspection of hotspots in patterns manufactured using the manufacturing parameter settings inside the process window. Specifically, in FIG. 3 the additional SEM inspection of hotspots in patterns manufactured using the manufacturing parameter settings inside the process window is performed if these hotspots were not previously subjected to SEM inspection, but the hotspots include a pattern matching the patterns manufactured using the manufacturing parameter settings outside the process window having SEM-defects. In FIG. 4, the additional SEM inspection is of hotspots in patterns manufactured using the manufacturing parameter settings inside the process window, and which have a pattern that was not previously subjected to any SEM inspection, whether manufactured using the manufacturing parameter settings inside or outside the process window.

Thus, FIG. 3 shows a conceptual example of a process window 162 represented as being within a two-dimensional matrix of focus-exposure parameters 160 for a specific pattern (e.g., master pattern A 164). Specifically, the process window 162 is only those focus-exposure parameters for master pattern A 164 which did not result in SEM-detected defects. The focus-exposure parameters of the matrix outside the process window 162 are represented shaded in FIG. 3 for ease of understanding. Thus, the upper and lower darker rows in matrix 160 are focus-exposure parameters for master pattern A 164 which resulted in SEM-detected defects, and the other rows in matrix 160 are focus-exposure parameters for the same master pattern A 164 which did not result in SEM-detected defects.

In FIG. 3 item 166 points to focus-exposure parameters for master pattern A 164 that are outside the process window 162 and that produced a hotspot and an SEM-defect. Item 168 points to two different focus-exposure parameters for the same master pattern A 164 that are inside the process window 162 and that both produced a hotspot, but the initial SEM (items 108 and 140, discussed above) did not select either of those hotspots for further analysis. The processing and systems herein therefore perform a second iteration SEM inspection (additional SEM) of the hotspots associated with item 168 within the process window 162.

Somewhat differently, FIG. 4 shows a conceptual example of a process window 172 also represented as being within a two-dimensional matrix of focus-exposure parameters 170 for a specific pattern (e.g., master pattern B 174). Specifically, the process window 172 is only those focus-exposure parameters for master pattern B 174 which did not result in SEM-detected defects. As with FIG. 3, the focus-exposure parameters of the matrix outside the process window 172 are represented darker in FIG. 4 for ease of understanding. Thus, the upper and lower darker rows in matrix 170 are focus-exposure parameters for master pattern B 174 which resulted in SEM-detected defects, and the other rows in matrix 170 are focus-exposure parameters for master pattern B 174 which did not result in SEM-detected defects.

In FIG. 4 item 176 notes that the initial SEM (items 108 and 140, discussed above) did not inspect master pattern B. Item 178 points to focus-exposure parameters for master pattern B 174 that are inside the process window 172 and that produced a hotspot. The processing and systems herein therefore perform a second iteration SEM inspection (additional SEM) of the hotspot associated with item 178 within the process window 172.

The above shows that the processing herein provides an effective way to identify SEM review sites for defect discovery after a BFI scan and first round of SEM review during process window qualification. This identifies design systematic defects by a down-selection of BFI (bright field inspection) defects for SEM review using process window aware pattern analysis. Specifically, this processing performs BFI and first SEM review during process window qualification, applies pattern classification to the BFI defects, consolidates with existing SEM confirmed defects, performs a pattern search to get the hit rate on each design, and uses the process window aware pattern analysis to pick the most severe BFI defects for further SEM review.

Figure 5:
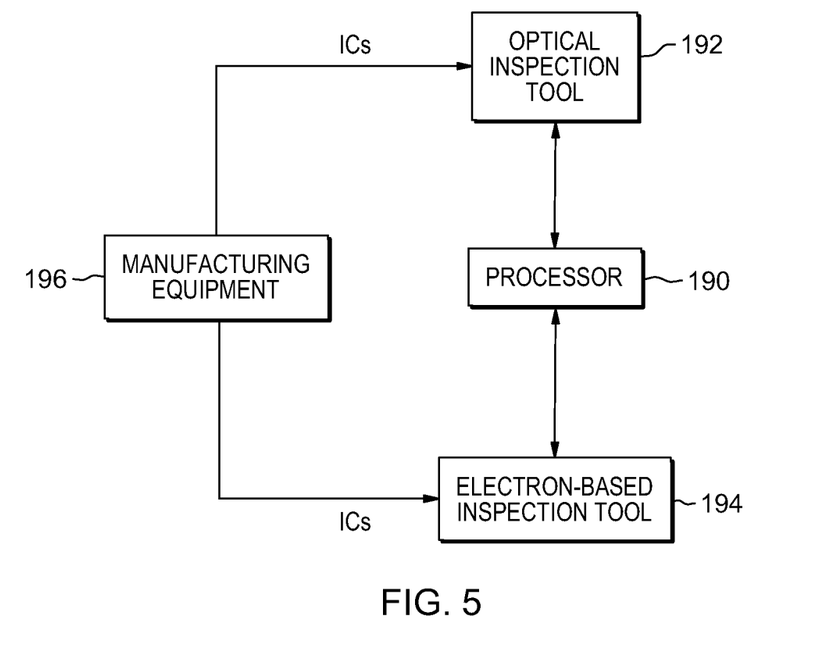
FIG. 5 is a schematic diagram of a system implementing the processing shown in FIGS. 1-4, according to embodiments herein.

FIG. 5 shows one implementation (of many possible implementations) of systems herein that can include, among other components, a processor 190 (a computer or systems of networked computers), an optical inspection tool 192 (e.g., bright field inspection (BFI) tool) operatively connected to the processor 190, an electron-based inspection tool 194 (e.g., scanning electron microscope (SEM)) operatively connected to the processor 190, and integrated circuit manufacturing equipment 196 (e.g., lithographic machines, mask production machines, assembly devices, packaging machines, transport devices, etc.). The manufacturing equipment 196 is adapted to manufacture focus-exposure modulated integrated circuit devices and other devices, as potentially controlled by the processor 190, and supply such focus-exposure modulated integrated circuit devices to the optical inspection tool 192 and electron-based inspection tool 194.

The optical inspection tool 192 is adapted to optically detect potential defects within the focus-exposure modulated integrated circuit devices. Again, the focus-exposure modulated integrated circuit devices has components formed in patterns because the manufacturing equipment is adapted to form the focus-exposure modulated integrated circuit devices using different manufacturing parameters for the patterns on different areas of the integrated circuit devices. The electron-based inspection tool 194 is adapted to perform a first electron-based inspection of less than all of the potential defects to identify primary actual defects.

The processor 190 is adapted to identify a process window of different manufacturing parameter settings. The patterns manufactured using the manufacturing parameter settings inside the process window have less than the threshold number of the primary actual defects resulting from the first electron-based inspection.

The electron-based inspection tool 194 is also adapted to identify additional actual defects by performing a second electron-based inspection of some of the patterns that meet all the following conditions: having the potential defects; being uninspected in the first electron-based inspection; and being within the process window. The electron-based inspection tool 194 is adapted to perform the second electron-based inspection within the process window on ones of the patterns that had the primary actual defects outside the process window. The electron-based inspection tool 194 is also adapted to perform the second electron-based inspection within the process window on ones of the patterns that were uninspected in the first electron-based inspection within or outside the process window.

The processor 190 is also adapted to rank the patterns based on a rate of occurrence of the patterns having the primary actual defects and establish a high-occurrence defective pattern set of most common defective patterns based on the ranking. The electron-based inspection tool 194 is further adapted to perform the second electron-based inspection within the process window on the high-occurrence defective pattern set.

The processor 190 is additionally adapted to rank the primary actual defects based on a rate of occurrence, establish a high-occurrence defect set of most common primary actual defects based on the ranking, and identify ones of the patterns in which the primary actual defects in the high-occurrence defect set occur as a high-defect pattern set. The electron-based inspection tool 194 is adapted to perform the second electron-based inspection within the process window on the high-defect pattern set.

Figure 6:
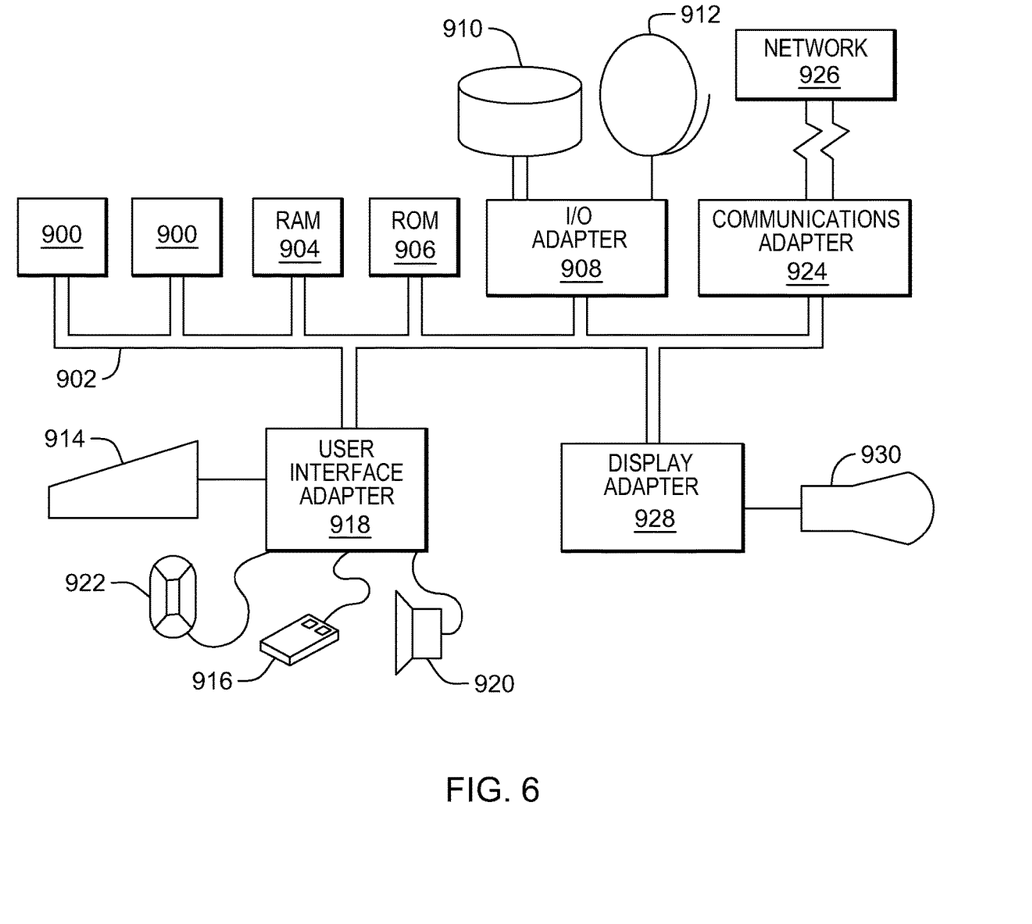
FIG. 6 is a schematic diagram of a hardware system according to embodiments herein.

A representative hardware environment (i.e., a computer system) for implementing the systems, methods and computer program products disclosed above is depicted in FIG. 6. This schematic drawing illustrates a hardware configuration of an information handling/computer system in accordance with the embodiments herein. The system incorporates at least one processor or central processing unit (CPU) 900. The CPUs 900 are interconnected via a system bus 902 to various devices such as a random access memory (RAM) 904, read-only memory (ROM) 906, and an input/output (I/O) adapter 908. The I/O adapter 908 can connect to peripheral devices, such as disk units 910 and tape drives 912, or other program storage devices that are readable by the system. The system can read the inventive instructions on the program storage devices and follow these instructions to execute the methodology of the embodiments herein. The system further includes a user interface adapter 918 that connects a keyboard 914, mouse 916, speaker 920, microphone 922, and/or other user interface devices such as a touch screen device (not shown) to the bus 902 to gather user input. Additionally, a communication adapter 924 connects the bus 902 to a data processing network 926, and a display adapter 928 connects the bus 902 to a display device 930 which may be embodied as an output device such as a monitor, printer, or transmitter, for example.

The flowchart and block diagrams in the accompanying figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise.

Each respective figures, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
   performing an optical inspection to detect potential defects within integrated circuit devices;

performing a first electron-based inspection of less than all of the potential defects to identify primary actual defects;

identifying a process window comprising settings of manufacturing parameters used to manufacture the integrated circuit devices, wherein the integrated circuit devices manufactured using manufacturing parameter settings inside the process window have less than a threshold number of the primary actual defects; and performing, to identify additional actual defects, a second electron-based inspection limited to selected ones of the potential defects in the integrated circuit devices manufactured using the manufacturing parameter settings inside the process window that were uninspected in the first electron-based inspection.

2. The method according to claim 1, wherein the integrated circuit devices include components formed in patterns, wherein the method further comprises:

ranking the patterns based on a rate of occurrence of the patterns having the primary actual defects; and establishing a high-occurrence defective pattern set of most common defective patterns based on the ranking, and wherein the second electron-based inspection is performed on the integrated circuit devices that have the patterns matching patterns of the high-occurrence defective pattern set.

3. The method according to claim 1, wherein the integrated circuit devices include components formed in patterns, wherein the method further comprises:

ranking the primary actual defects based on a rate of occurrence; and establishing a high-occurrence defect set of most common primary actual defects based on the ranking; and identifying ones of the patterns in which the primary actual defects in the high-occurrence defect set occur as a high-defect pattern set, wherein the second electron-based inspection is performed on the integrated circuit devices that have the patterns matching patterns of the high-defect pattern set.

4. The method according to claim 1, wherein the second electron-based inspection is performed on ones of the potential defects in component patterns matching component patterns manufactured using manufacturing parameter settings outside the process window and that have the primary actual defects.

5. The method according to claim 1, wherein the second electron-based inspection is performed on ones of the potential defects in the integrated circuit devices that have component patterns matching component patterns of the integrated circuit devices manufactured using manufacturing parameter settings outside the process window and that were uninspected in the first electron-based inspection.

6. The method according to claim 1, wherein the manufacturing parameters include exposure and focus.

7. The method according to claim 1, wherein the optical inspection comprises bright field inspection (BFI) and the first electron-based inspection and the second electron-based inspection comprise scanning electron microscope (SEM) inspection.

8. A method comprising:

manufacturing integrated circuit devices to include components formed in patterns, wherein the manufacturing of the integrated circuit devices uses different manufacturing parameters for the patterns on different ones of the integrated circuit devices, and wherein each pattern is formed differently multiple times using the different manufacturing parameters;

performing an optical inspection to detect potential defects in the integrated circuit devices;

performing a first electron-based inspection on less than all of the potential defects to identify primary actual defects;

identifying a process window comprising settings of manufacturing parameters, wherein ones of the patterns manufactured using the manufacturing parameter settings outside the process window have at least a threshold number of the primary actual defects, and wherein ones of the patterns manufactured using the manufacturing parameter settings inside the process window have less than the threshold number of the primary actual defects; and performing, to identify additional actual defects, a second electron-based inspection limited to some of the patterns that meet all conditions of:

having the potential defects;

being uninspected in the first electron-based inspection; and being patterns manufactured using the manufacturing parameter settings inside the process window.

9. The method according to claim 8, further comprising:

ranking the patterns based on a rate of occurrence of the patterns having the primary actual defects; and establishing a high-occurrence defective pattern set of most common defective patterns based on the ranking, wherein the second electron-based inspection is performed on the patterns matching patterns of the high-occurrence defective pattern set.

10. The method according to claim 8, further comprising:

ranking the primary actual defects based on a rate of occurrence; and establishing a high-occurrence defect set of most common primary actual defects based on the ranking; and identifying ones of the patterns in which the primary actual defects in the high-occurrence defect set occur as a high-defect pattern set, wherein the second electron-based inspection is performed on the patterns matching patterns of the high-defect pattern set.

11. The method according to claim 8, wherein the second electron-based inspection is performed on ones of the patterns that match the patterns manufactured using the manufacturing parameter settings outside the process window and that have the primary actual defects.

12. The method according to claim 8, wherein the second electron-based inspection is performed on ones of the patterns that match the patterns manufactured using the manufacturing parameter settings outside the process window and that were uninspected in the first electron-based inspection.

13. The method according to claim 8, wherein the manufacturing parameters include exposure and focus.

14. The method according to claim 8, wherein the optical inspection comprises bright field inspection (BFI) and the first electron-based inspection and the second electron-based inspection comprise scanning electron microscope (SEM) inspection.

15. A system comprising:

a processor;

an optical inspection tool operatively connected to the processor; and an electron-based inspection tool operatively connected to the processor, wherein the optical inspection tool is adapted to optically detect potential defects in integrated circuit devices, wherein the integrated circuit devices have components formed in patterns, wherein the integrated circuit devices are formed using different manufacturing parameters for the patterns on different ones of the integrated circuit devices, wherein the electron-based inspection tool is adapted to perform a first electron-based inspection of less than all of the potential defects to identify primary actual defects, wherein the processor is adapted to identify a process window comprising settings of manufacturing parameters, wherein ones of the patterns manufactured using the manufacturing parameter settings inside the process window have less than a threshold number of the primary actual defects, and wherein the electron-based inspection tool is adapted to identify additional actual defects by performing a second electron-based inspection of some of the patterns that meet all conditions of:
having the potential defects;
being uninspected in the first electron-based inspection; and
being patterns manufactured using the manufacturing parameter settings inside the process window.

16. The system according to claim 15, wherein the processor is adapted to:
rank the patterns based on a rate of occurrence of the patterns having the primary actual defects; and
establish a high-occurrence defective pattern set of most common defective patterns based on the ranking, and wherein the electron-based inspection tool is adapted to perform the second electron-based inspection on the patterns matching patterns of the high-occurrence defective pattern set.

17. The system according to claim 15, wherein the processor is adapted to:
rank the primary actual defects based on a rate of occurrence; and
establish a high-occurrence defect set of most common primary actual defects based on the ranking; and
identify ones of the patterns in which the primary actual defects in the high-occurrence defect set occur as a high-defect pattern set, and wherein the electron-based inspection tool is adapted to perform the second electron-based inspection on the patterns matching patterns of the high-defect pattern set.

18. The system according to claim 15, wherein the electron-based inspection tool is adapted to perform the second electron-based inspection on ones of the patterns that match the patterns manufactured using the manufacturing parameter settings outside the process window and that have the primary actual defects.

19. The system according to claim 15, wherein the electron-based inspection tool is adapted to perform the second electron-based inspection on ones of the patterns that match the patterns manufactured using the manufacturing parameter settings outside the process window and that were uninspected in the first electron-based inspection.

20. The system according to claim 15, wherein the optical inspection tool comprises a bright field inspection (BFI) tool, and
wherein the electron-based inspection tool comprises a scanning electron microscope (SEM).

* * * * *